United States Patent [19]

Vernet

[11] 3,780,211

[45] Dec. 18, 1973

[54] INSULATING PRINTED-CIRCUIT BOARD HAVING PIN-SHAPED CONNECTING MEMBERS

[76] Inventor: Francis Vernet, 49, rue Gay-Lussac, Paris, France

[22] Filed: Dec. 29, 1971

[21] Appl. No.: 213,252

[30] Foreign Application Priority Data

Jan. 8, 1971 France .............................. 7100487

[52] U.S. Cl. ........ 174/68.5, 317/101 CC, 339/17 C
[51] Int. Cl. ............................................ H05k 1/10
[58] Field of Search .................. 174/68.5; 339/17 C, 339/275 R, 275 B; 317/101 CC, 101 CM; 29/626

[56] References Cited

UNITED STATES PATENTS 3,325,766 6/1967 Kolb et al. .................... 174/68.5 X
3,569,607 3/1971 Martyak et al. .................. 174/68.5
3,644,792 2/1972 Fields.......................... 174/68.5 X

*Primary Examiner*—Bernard A. Gilheany
*Assistant Examiner*—David A. Tone
*Attorney*—Frank R. Trifari

[57] ABSTRACT

A printed circuit board having connection members mounted thereon. Connecting wires of circuit elements are inserted into sleeves of the connection members which are inserted in the insulating printed-circuit board. The connecting wires are then connected by means of solder carried in the sleeves. The sleeves project from one side of the board, and pin-shaped sections of the connection member project from the other side of the board.

4 Claims, 7 Drawing Figures

INSULATING PRINTED-CIRCUIT BOARD HAVING PIN-SHAPED CONNECTING MEMBERS

The invention relates to an insulating printed-circuit board having mainly pin-shaped connecting members for mounting and connecting, in particular by wrap connections, of electronic circuit elements.

The wrap connection makes it possible to wire units having a large number of connections by means of programmable machines, but in practice the connection of the connecting leads of the circuit elements — in particular components having integrated circuits — to the pin-shaped connecting members is possible only by soldering. The object of the invention is to facilitate this soldering operation.

According to the invention this is achieved in that on one side of the printed-circuit board, integral to each of the connecting members, a sleeve-like connecting portion is formed perpendicular to the board. The sleeve can envelope a connecting wire of a circuit element and can contain an amount of solder. A bent part of the pin-shaped member adjoining the sleeve is clamped in the board. The solderable ends of the connecting wires need only be placed in the sleeve-like connecting portions and, after heating, a reliable soldered joint will have been realized due to the fact that a sleeve can contain a comparatively large amount of solder. The solder material can be placed in the sleeve in the form of a ring of self-cleaning solder, the end of the connecting wire being inserted into the said ring before or after the ring is provided in the sleeve.

It is to be noted that the well-known solderable flanged eyelet, on which a connecting tag may be formed if desired, is also a sleeve capable of containing solder. However, in this case the sleeve itself is secured in the printed-circuit board, which requires a special operation. Moreover, the flanged eyelet is accessible only at the ends which hampers the heating.

In order that the invention may be readily carried into effect, one embodiment thereof will now be described in detail, by way of example, with reference to the accompanying diagrammatic drawing, in which.

Figure 2:
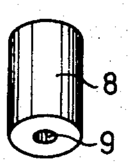
FIG. 2 is a perspective view of a ring of solder to be used in conjunction therewith.
Figure 1:
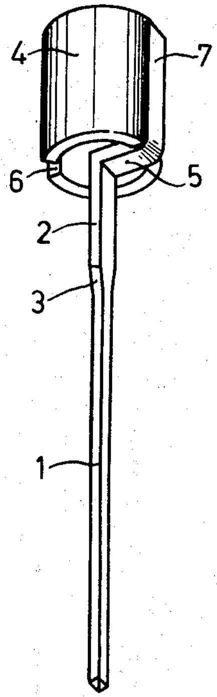
FIG. 1 is a perspective view of a connecting member according to the invention.

The connecting member shown in FIG. 1 comprises a pin 1 having a rectangular cross section, and is preferably suitable for a wrap connection. The pin 1 changes into a strip section 2, again having a rectangular cross section but wider than that of the pin 1, preferably via a transition 3 having a gradually increasing section. The cross section and the length of the strip portion 2 are suitable to enable the entire connecting member to be clamped in an adapted aperture, of an insulating printed-circuit board. The strip section 2 is integrally connected to a preferably cylindrical sleeve 4 via a part 5 which is bent at right angles. The axis of the pin 1 and strip section 2 preferably coincides with the axis of the sleeve 4. The latter is provided with an axial slit extending over its entire length at 6, preferably according to a describing line which is situated diametrically opposite from the point where the portion 5 adjoins the sleeve 4. If the described connecting member is manufactured by punching from sheet material, it is permissible, in order to facilitate the shaping of the sleeve 4, that the element 7 thereof, forming the continuation of the bent part 5, is a flat strip. In the sleeve 4 an amount of solder material may be provided by inserting a ring 8 of self-cleaning solder (see FIG. 2), the central aperture 9 of which is sufficiently large for insertion of a connecting wire 19 (see FIG. 3), for example, of a component having an integrated circuit.

After a number of the described connecting members have been secured in an insulating printed-circuit board 10 such that the sleeves 4 project from the one side and the pins 1 project from the other side of the plate 10 (see FIG. 3), the sleeves 4 are heated until the solder masses 8 have melted, so that the desired soldered joints have been realized. The melting and the level of the molten solder can be observed through the gap 6 (FIG. 3) of the sleeve 4. After cooling, the connecting wires 13 and 15 can be wrapped around the pin 1 in known manner.

In the embodiment shown the cylindrical sleeve 4 is coaxial with the pin 1 of the connecting member. The connecting members can then be mounted in arbitrary positions next to each other, which facilitates mounting, particularly in the case of a small mutual distance, for example, 2.5 mm.

Figures 3, 4, 5:
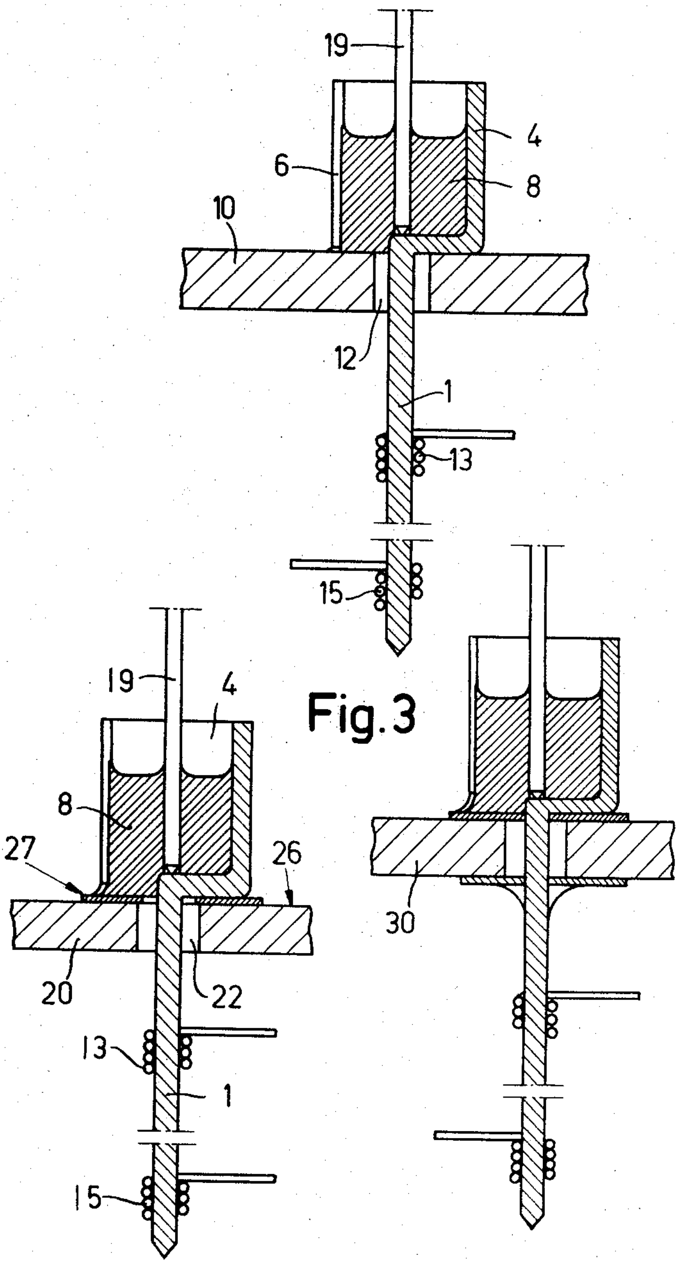
FIGS. 3 to 5 are sectional views of connecting members provided on printed-circuit boards.

If one of the surfaces of the insulating printed-circuit board on which mounting is effected is provided with a printed circuit, the mounting of a connecting member may be as shown in FIG. 4. The solder mass 8 melted inside the sleeve 4 wets a metallized area 27 underneath the sleeve 4 which closes this sleeve at the lower side and which forms part of the printed circuit on the surface 26 of the insulating printed-circuit board 20, a soldered contact thus being established not only with the component wire 19 in the sleeve 4 but also with the printed-circuit. FIG. 5, which is self-explanatory, illustrates the mounting procedure when both surfaces of the insulating board 30 on which mounting is effected are provided with a printed circuit.

In all cases the distance between the sleeve and the board must be sufficiently small so as to prevent the molten solder from flowing out of the metallized areas or from the sleeve; the bent part 5, bent at right angles (FIG. 1) and constituting at least a partial closing of the sleeve 4, can also make a contribution in this respect.

Figure 6:
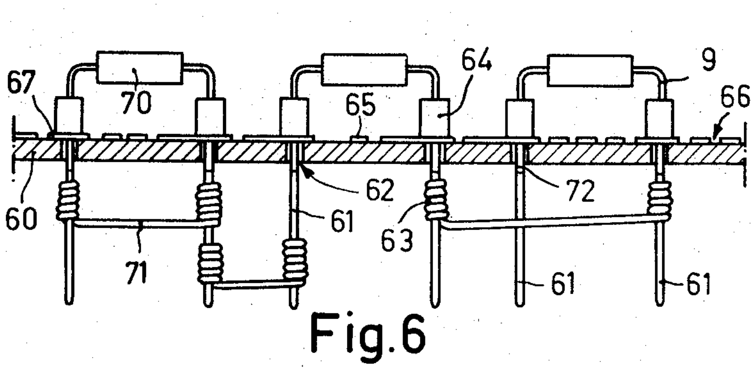
FIG. 6 is a sectional view taken on the line VI—VI in FIG. 7 of an assembly of mounted and mutually connected connecting members.
Figure 7:
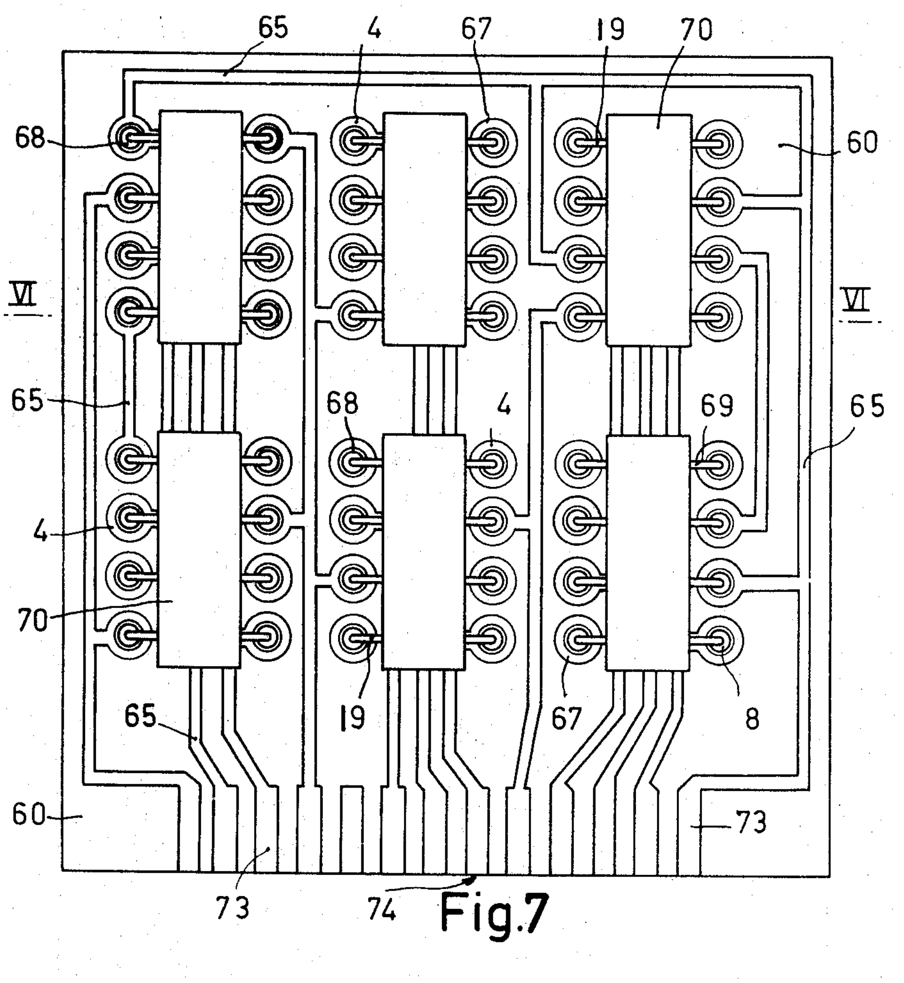
FIG. 7 is a plan view of the assembly shown in FIG. 6.

FIGS. 6 and 7 show an insertable board comprising components having integrated circuits and being connected together according to the invention in order to perform a logic function. The components 70 are provided with small strip-shaped connecting conductors 19 which are situated in solder masses 8 in the sleeves 4 of the connecting members inserted in the insulating printed-circuit board 60, the desired connections thus being established.

What is claimed is:

1. In combination, an insulating printed circuit board and a connecting member securely carried on said board, said connecting member comprising a pin-shaped portion projecting from at least one side of said board for connecting thereto electronic circuit elements by wrap connection, a substantially cylindrical sleeve-like element integral with said pin-shaped portion projecting from the other side of said board substantially perpendicular thereto, said connecting member being clamped to said board at the area where said sleeve adjoins said pin shaped portion, an axial slit extending through said cylinder, and a solderable metal layer carried on said board closing that end of said cylindrical sleeve facing the board so that said sleeve is capable of containing an amount of solder for holding a connecting wire of a circuit element when inserted therein.

2. The combination according to claim 1 wherein said sleeve-like element is coaxial with said pin-shaped portion.

3. In combination, an insulating printed circuit board and a connecting member securely carried on said board, said connecting member comprising a pin-shaped portion projecting from at least one side of said board for connecting thereto electronic circuit elements by wrap connection, a substantially cylindrical sleeve-like element integral with said pin-shaped portion projecting from the other side of said board substantially perpendicular thereto, said connecting member being clamped to said board at the area where said sleeve adjoins said pin-shaped portion, an axial slit extending through said cylinder and part of said pin-shaped portion bent at right angles thereto closing that end of said cylindrical sleeve facing the board so that said sleeve is capable of containing an amount of solder for holding a connecting wire of a circuit element when inserted therein.

4. The combination according to claim 3 wherein said sleeve-like element is coaxial with said pin-shaped portion.

* * * * *

PO-1050
(5/69)

UNITED STATES PATENT OFFICE
CERTIFICATE OF CORRECTION

Patent No. 3780211 Dated December 18, 1973

Inventor(s) Francis Vernet

It is certified that error appears in the above-identified patent and that said Letters Patent are hereby corrected as shown below:

In the heading, after "[76] Inventor:"

insert --[73] Assignee: U.S. Philips Corp., New York, N.Y.--

Column 1, line 6, before "for mounting" insert

-- .A pin projects from one side of the board--

Signed and sealed this 9th day of April 1974.

(SEAL)
Attest:

EDWARD M.FLETCHER,JR.
Attesting Officer

C. MARSHALL DANN
Commissioner of Patents